(12) United States Patent
Feiweier

(10) Patent No.: US 11,215,683 B2
(45) Date of Patent: Jan. 4, 2022

(54) METHOD AND MAGNETIC RESONANCE APPARATUS CORRECTION OF MULTIPLE DISTORTION EFFECTS DURING MAGNETIC RESONANCE IMAGING

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 716 days.

(21) Appl. No.: 15/982,310

(22) Filed: May 17, 2018

(65) Prior Publication Data

US 2018/0335488 A1     Nov. 22, 2018

(30) Foreign Application Priority Data

May 17, 2017    (DE) .......................... 102017208335.2

(51) Int. Cl.
| | | |
|---|---|---|
| *G01R 33/24* | (2006.01) | |
| *G01R 35/00* | (2006.01) | |
| *G06T 7/30* | (2017.01) | |
| *G01R 33/565* | (2006.01) | |

(52) U.S. Cl.
CPC ..... *G01R 33/246* (2013.01); *G01R 33/56563* (2013.01); *G01R 33/56572* (2013.01); *G01R 35/005* (2013.01); *G06T 7/30* (2017.01); *G01R 33/56581* (2013.01)

(58) Field of Classification Search
CPC ............ G01R 33/246; G01R 33/56563; G01R 33/56572; G01R 35/005; G01R 33/56581; G06T 7/30
See application file for complete search history.

(56) References Cited

U.S. PATENT DOCUMENTS

| | | |
|---|---|---|
| 4,591,789 A | 5/1986 | Glover et al. |
| 5,886,524 A | 3/1999 | Krieg |
| 8,508,226 B2 | 8/2013 | Feiweier et al. |
| 8,854,037 B2 | 10/2014 | Feiweier |
| 2008/0068012 A1 | 3/2008 | Werthner |

(Continued)

OTHER PUBLICATIONS

Bernstein et al., "Concomitant Gradient Terms in Phase Contrast MR: Analysis and Correction," Magnetic Resonance in Medicine, vol. 39, No. 2, pp. 300-308 (1998).

(Continued)

*Primary Examiner* — Rishi R Patel

(74) *Attorney, Agent, or Firm* — Schiff Hardin LLP

(57) ABSTRACT

Magnetic resonance (MR) data are acquired from a volume segment of an examination object and an MR image composed of multiple image pixels is reconstructed therefrom. For a magnetic field assumed to have been generated by the scanner, a summed field deviation is calculated, from which a respective displacement vector is calculated for each image pixel. A signal portion is assigned to each image pixel that has been displaced with the respective displacement vector from the respective image pixel. The summed field deviation is the sum of deviations caused by at least two of: non-linearities in gradient coils, Maxwell fields, field inhomogeneities independent of the gradients, and dynamic field disturbances.

18 Claims, 3 Drawing Sheets

(56) References Cited

U.S. PATENT DOCUMENTS

| | | | | |
|---|---|---|---|---|
| 2013/0285653 A1* | 10/2013 | Zhou | ............... | G01R 33/56341 324/307 |
| 2015/0077107 A1* | 3/2015 | Sharp | ................ | G01R 33/4625 324/309 |
| 2015/0108984 A1* | 4/2015 | Pfeuffer | ............ | G01R 33/4833 324/322 |
| 2015/0146999 A1 | 5/2015 | Feiweier et al. | | |

OTHER PUBLICATIONS

Baldwin et al., "A two-step scheme for distortion rectification of magnetic resonance images," Medical Physics, vol. 36, No. 9, pp. 3917-3926 (2009).

Lorenz et al., "Influence of Eddy Current, Maxwell and Gradient Field Corrections on 3D Flow Visualization of 3D CINE PC-MRI Data," Magnetic Resonance in Medicine, vol. 72, pp. 33-40 (2014).

Peeters et al., "Analysis and Correction of Gradient Nonlinearity and $B_0$ Inhomogeneity Related Scaling Errors in Two-Dimensional Phase Contrast Flow Measurements," Magnetic Resonance in Medicine, vol. 53, pp. 126-133 (2005).

Cheng et al., "Fast Concomitant Gradient Field and Field Inhomogeneity Correction for Spiral Cardiac Imaging," Magnetic Resonance in Medicine, vol. 66, pp. 390-401 (2011).

Markl et al., "Generalized Reconstruction of Phase Contrast MRI: Analysis and Correction of the Effect of Gradient Field Distortions," Magnetic Resonance in Medicine, vol. 50, pp. 791-801 (2003).

Jezzard, et al.: "Characterization of and Correction for Eddy-Current Artifacts in Echo-Planar Diffusion Imaging", Magn. Reson. Med., vol. 39, pp. 801-812 (1998).

Meier, et al.: Concomitant Field Terms for Asymmetric Gradient Coils: Consequences for Diffusion, Flow, and Echo-Planar Imaging, Magn. Reson. Med., vol. 60, pp. 128-134 (2008).

Zhou, et al.: "Concomitant Magnetic-Field-Induced Artifacts in Axial Echo Planar Imaging", Magnetic Resonance Med., vol. 39, p. 596 (1998).

Munger, et al.: "An Inverse Problem Approach to the Correction of Distortion in EPI Images", IEEE Transactions on Medical Imaging, vol. 19, No. 7, pp. 681-689 (2000).

Jezzard, et al.: "Correction for Geometric Distortion in Echo Planar Images from $B_0$ Field Variations", Magnetic Resonance in Medicine, vol. 34, pp. 65-73 (1995).

* cited by examiner

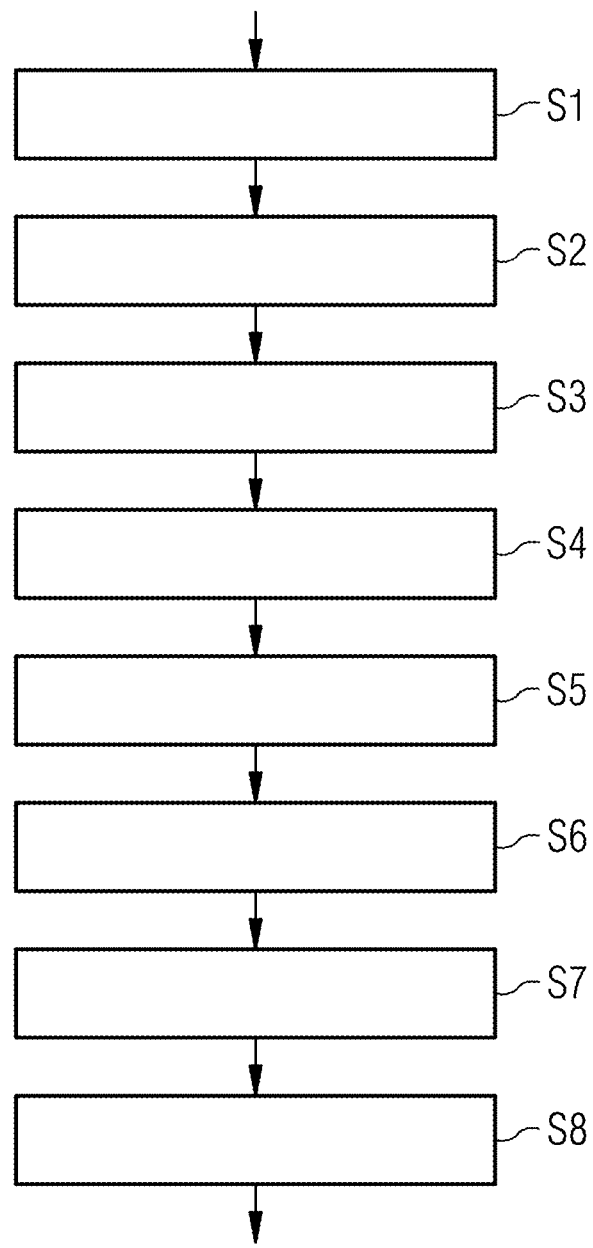

METHOD AND MAGNETIC RESONANCE APPARATUS CORRECTION OF MULTIPLE DISTORTION EFFECTS DURING MAGNETIC RESONANCE IMAGING

BACKGROUND OF THE INVENTION

Field of the Invention

The present invention concerns the correction of multiple distortion effects as a result of field deviations that occur during the acquisition of raw data for magnetic resonance (MR) imaging.

Description of the Prior Art

Magnetic resonance tomography currently represents an essential method in medical diagnostics. Special importance is attached to the geometric mapping accuracy of the MR images, particularly in connection with interventions (for instance with the resection of tumors).

DE 10 2013 224 406 B4 and U.S. Pat. No. 8,854,037 B2 disclose methods of distortion correction in MR imaging.

SUMMARY OF THE INVENTION

MR image reconstruction (typically using Fourier transform) takes place assuming that the basic magnetic field generated by the magnetic resonance scanner is precisely known. The present invention therefore has the object of accurately determining field deviations during the acquisition of MR raw data and to take into account the effects of such field deviations during the image data reconstruction.

The present invention encompasses a method for the correction of multiple distortion effects during imaging by operation of a magnetic resonance system. The inventive method has the following steps.

MR raw data are acquired from a volume segment of an examination object by operation of the MR scanner of an MR apparatus.

At least one MR image, which has multiple image pixels, is reconstructed in a computer from the acquired MR data.

The computer calculates a summed field deviation with respect to a magnetic field. This is assumed to have been generated by the MR scanner during the MR raw data acquisition. The calculated summed field deviation thus specifies how the real magnetic field generated by the MR scanner differs from the magnetic field. This is ideally or theoretically expected to be generated by the MR scanner. In other words, the summed field deviation corresponds to the difference between the actual magnetic field and the target magnetic field, wherein the summed field deviation takes into account the effects that are most important to the respectively used imaging protocol (pulse sequence).

The computer calculates a respective displacement vector for each of the target image pixels as a function of the calculated summed field deviation. A target image pixel has a position (location) and a signal contribution (value or a signal) to overall reconstructed image. If the target magnetic field corresponds to the actual magnetic field, then the signal contribution of a particular target image pixel will correspond to the signal portion that was also determined at the position of that target image pixel, resulting from the MR data acquisition and subsequent reconstruction at the position of the target image pixel.

The computer assigns a respective signal portion to the target image pixels. This signal portion corresponds to the signal portion of an actual image pixel, which has been displaced with the respective displacement vector from the location of the target image pixel, to which the signal portion is assigned. In reality, the actual magnetic field deviates from the target magnetic field, which, in accordance with the invention, is taken into account on the basis of the summed field deviation. Following the MR data acquisition and reconstruction, the signal portion of the target image pixel is therefore at the point of the actual image pixel. In accordance with the invention, the signal portion of the actual image pixel, the position of which is calculated on the basis of the displacement vector valid for the respective target image pixel, is therefore assigned in each case to the respective target image pixel.

Two, three or four of the following field deviations are summed during the calculation of the summed field deviation.

1. A Field Deviation of the Magnetic Field Caused by Non-Linearities in the Gradient System of the Magnetic Resonance System Typically linear field gradients are used for the spatial encoding. In other words, the magnetic field generated by an axis x or y or z of the gradient coil system ideally runs along the respective spatial axis x or y or z according to the following equations (1) to (3).

$$B_x(x,y,z) = (0,0,G_x * x) \quad (1)$$

$$B_y(x,y,z) = (0,0,G_y * y) \quad (2)$$

$$B_z(x,y,z) = (0,0,G_z * z) \quad (3)$$

The image reconstruction is performed under the assumption that this linear relationship is valid. Design-related deviations, however, result in a non-linear relationship, so that the actual field profile deviates from the assumption idealized in the equations (1) to (3), which during both the slice selection and also the phase and frequency encoding directly results in spatial misallocations in the reconstructed images.

2. A Field Deviation of the Magnetic Field Caused by Maxwell Fields

Typically during the reconstruction of the MR images or the corresponding signal equations, account is only taken of those components of the spatial encoding fields, which are parallel to the basic field so that there is no component in the x and y direction, for instance, as is the case in the equations (1) to (3).

These field geometries actually do not satisfy the Maxwell equations, however, so that transverse components appear along the other coordinate directions (x, y). These transverse components are relevant to the signal evolution and result in spatial misallocations, which are particularly marked for instance along the phase encoding direction during the echo-planar imaging.

3. A Field Deviation Caused by Field Inhomogeneities

Design-related field inhomogeneities of the basic magnetic field exist. Other field changes, which likewise result in field inhomogeneities, also exist in the vicinity of changes to the magnetic susceptibility (for instance upon the transition between air inclusions and tissue as found in the sinuses or the lungs of a patient). These field inhomogeneities or deviations from the target magnetic field result directly in spatial misallocations during the slice excitation (also referred as the "potato-chip effect") and during the frequency encoding. During the image reconstruction, distortions are particularly clearly marked as a result of these field inhomogeneities if the local field deviations cumulatively move into the spatial encoding over a longer period of time, as is the case, for instance, along the phase encoding direction during the echo-planar imaging.

4. A Field Deviation Caused by Dynamic Field Disturbances

The switching of spatial encoding fields, which are generated by the gradient coils, for instance, results in the induction of eddy currents in conducting structures of the magnetic resonance system, which, for their part, generate temporally decaying field disturbances. Although current magnetic resonance systems have predistortion mechanisms (also known as "pre-emphasis") for reducing this effect, residual dynamic field disturbances still remain, such as in particular field disturbances with geometries which can be described by spherical surface functions of higher orders. If field disturbances of this type are present during the spatial encoding, this results directly in spatial misallocations. These spatial misallocations or distortions are particularly clearly marked if the local field deviations cumulatively move into the spatial encoding over a longer period of time, as is the case, for instance, along the phase encoding direction during the echo-planar imaging. Echo-planar diffusion imaging, which uses intensive gradient pulses for the diffusion encoding directly before the sensitive recording module, is particularly noteworthy in this context.

In accordance with the invention, two, three or all four of the previously described field deviations are now summed, in order to form the summed field deviation, as a function of which the corresponding displacement vector of the respective image pixel is then calculated, in order finally to correct the various distortion effects during the imaging. This distortion-corrected image is made available from the computer, in which the image reconstruction takes place, in electronic form, as a date file. The inventive method is compared below with a fictitious procedure, which takes two of the previously described field deviations into account in two separate steps, for instance. With this fictitious procedure, only a first of the previously described field deviations is calculated in the first step, in order to correct the corresponding distortion effect during the imaging as a function of the first field deviation. Next, in a second step of the fictitious procedure, which follows on from the first step, a second of the previously described field deviations is calculated, in order to correct the corresponding distortion effect during the imaging as a function of the second field deviation. Compared with this fictitious procedure, the present invention has the following advantages:

Both the first step and the second step of the fictitious procedure require a complicated image transformation, so that a longer processing time results compared with the present invention.

Interpolations are generally used in the inventive method and also in the first and second step of the fictitious procedure. Since these interpolations in the fictitious procedure are applied in each individual step (i.e. in the first step and in the second step of the fictitious procedure), this results overall in a poorer image quality (e.g. image blurs) in the fictitious procedure compared with the present invention.

By a number of the previously described distortion effects being take into account in order to calculate the summed field deviation, dependencies between the individual physical effects can advantageously also be taken into account; this is not possible with the fictitious procedure. If a correction of the field deviation caused by Maxwell fields is carried out independently of the correction of the field deviation caused by field inhomogeneities, for instance, then during the fictitious procedure the spatial assignment of image information is still incorrect in regions with a strong B0 field inhomogeneity, since an incomplete correction of the transverse components is present.

Since the effects of the previously described field deviations on the calculation of the respective displacement vector are not linear, the inventive calculation of the respective displacement vector is more accurate than with the fictitious procedure.

Furthermore, it should be noted that according to the present invention the summed field deviation is not measured, but is instead otherwise determined or calculated.

Prior knowledge of the characteristics (geometry and amplitude) of the respectively considered field deviation is required in order to realize the present invention.

For instance, the field deviation caused by the non-linearities is produced from the design of the gradient coil or the gradient system, so that this field deviation can either be specified or measured once for each type of gradient system or individually for each gradient system.

The field deviation caused by the Maxwell fields can be calculated on the basis of the Maxwell equations, possibly taking design-related asymmetry parameters of the gradient coil or gradient system into account.

The calculation or determination of the field deviation caused by the field inhomogeneities generally requires knowledge of the magnetic interaction of the examination object with the basic field, so that this field deviation can be determined, for instance, by suitable premeasurements (prior to the actual data acquisition).

Aside from the previously described susceptibility-related inhomogeneities, the basic field inhomogeneities can also be taken into account. To this end, these basic field inhomogeneities or inhomogeneities of the B0 field are determined by measuring the magnetic field of the magnetic resonance system during the installation and/or maintenance of the magnetic resonance system, in order then to calculate the field deviation caused by the field inhomogeneities on the basis of these inhomogeneities.

The calculation or determination of the field deviation caused by dynamic field disturbances can likewise be determined on the basis of suitable premeasurements as a result of the complexity of sequence profiles and magnetic field interactions. Here, relatively long time constants can be used, so that during defined segments of a pulse sequence used to acquire MR data, an average, constant magnetic field, i.e. a type of average value of the magnetic flux density or magnetic field strength, can be assumed.

The knowledge underlying the invention is that the respectively considered physical effects result in a local change in the magnetic field relevant to the spatial encoding. If all four previously cited effects or field deviations are taken into account, for instance, a magnetic field with the amplitude $B(x, y, z)$ is achieved at location $r=(x, y, z)$ in accordance with the following equation (4).

$$B(x,y,z)=B_0+G_x\cdot x+G_y\cdot y+G_z\cdot z+\Delta B_{NL}(x,y,z,G_x,G_y,G_z)+\Delta B_{MW}(x,y,z,G_x,G_y,G_z)+\Delta B_{IH}(x,y,z)+\Delta B_{WS}(x,y,Z,G_x(t),G_y(t),G_z(t)) \quad (4)$$

where Gx or Gy or Gz corresponds to the magnetic field gradient in the x or y or z direction.

$\Delta B_{NL}$ corresponds to the field deviation caused by non-linearities in the gradient system at location r, which depends both in terms of its geometry on the gradient axes x, y, z and in terms of its characteristics is also scaled linearly with the gradient amplitude.

$\Delta B_{MW}$ corresponds to the field deviation caused by Maxwell fields at location r, which likewise depends in terms of its geometry on the gradient axes but is not scaled linearly with the gradient amplitude.

$\Delta B_{IH}$ corresponds to the field deviation caused by field inhomogeneities at location r, which is independent of the applied gradients.

$\Delta B_{WS}$ corresponds to the field deviation caused by dynamic field disturbances at location r, which likewise depends in terms of its geometry on the gradient axes and on the history of the applied gradients so that this field deviation has a time dependency.

The field deviation $\Delta B(x, y, z)$ can be calculated on the basis of the following equation (5):

$$\Delta B(x,y,z) = B(x,y,z) - (B_0 + G_x \cdot x + G_y \cdot y + G_z \cdot z) \quad (5)$$

This field deviation $\Delta B(x, y, z)$ can be equated to the inventive summed field deviation, which can be inferred from the following equation (6).

$$\Delta B(x,y,z) = \Sigma_i \Delta B_i \quad (6)$$

If all four previously described field deviations are taken into account, the following equation (7) applies.

$$\Delta B(x,y,z) = \Delta B_{NL}(x,y,z,G_x,G_y,G_z) + \Delta B_{MW}(x,y,z,G_x,G_y,G_z) + \Delta B_{IH}(x,y,z) + \Delta B_{WS}(x,y,z,G_x(t),G_y(t),G_z(t)) \quad (7)$$

Once the summed field deviation has been calculated in accordance with the invention on the basis of the required prior knowledge, the effects of the summed field deviation on the imaging method are calculated or determined in the following steps in accordance with the invention. To this end, it is advantageous to change from the physical gradient axes x, y, z to the recording axes "slice encoding", "frequency encoding" and "phase encoding" relevant to the imaging. How the summed field deviation of the actual magnetic field from the theoretical target magnetic field or ideal value affects the reconstructed images depends in particular on the encoding phase (e.g. slice encoding, frequency encoding, phase encoding) at which the summed field deviation exists.

During an imaging with spatial-selective excitation or slice selection (i.e. a frequency-selective RF pulse is applied while simultaneously switching a gradient pulse on the slice selection axis), the position and the location of the slice are influenced by those field deviations which appear during the slice selection. The sum of these field deviations or the field deviation $\Delta B_S$ summed during the slice selection can be calculated by the following equation (8).

$$\Delta B_S = \Sigma_i B_{i,S} \quad (8)$$

where $B_{i,S}$ corresponds to those of the previously described field deviations, which are present in a time interval during which the slice selection takes place, and are taken into account in accordance with the invention.

A non-selective excitation (for instance during the three-dimensional imaging) is not affected by this effect, so that in such cases the field deviation summed during the slice selection does not have to be calculated.

On the basis of the field deviation $\Delta B_S$ summed during the slice selection, the length or magnitude $\Delta S$ of a local spatial slice selection displacement vector can be calculated as a function of the amplitude $G_S$ of the slice selection gradient in accordance with the following equation (9). The slice selection displacement vector can then be calculated by multiplying the length $\Delta S$ by a unit vector $e_S$, which runs along the slice encoding direction.

$$\Delta S = \frac{\Delta B_s}{G_s} \quad (9)$$

Alternatively, this length $\Delta S$ of the slice selection displacement vector can be calculated as a function of an excitation pixel bandwidth $BW_{Tx}$, with the following equation (10), wherein $\gamma$ corresponds to the gyromagnetic ratio.

$$\Delta S = \frac{\gamma}{2\pi} \cdot \frac{\Delta B_s}{BW_{Tx}} \quad (10)$$

The data acquisition takes place during a frequency-encoded imaging, while a gradient is present at the same time along the frequency encoding axis. The field deviations present during the frequency encoding therefore influence the spatial assignment of the recorded signals. The sum of these field deviations or the field deviation $\Delta B_F$ summed during the frequency encoding can be calculated by the following equation (11).

$$\Delta B_F = \Sigma_i B_{i,F} \quad (11)$$

where $B_{i,F}$ corresponds to those of the previously described field deviations, which are present in a time interval during which the frequency encoding takes place, and are taken into account in accordance with the invention.

On the basis of the field deviation $\Delta B_F$ summed during the frequency encoding, the length or magnitude $\Delta F$ of a local spatial frequency encoding displacement vector can be calculated as a function of the amplitude $G_F$ of the frequency encoding gradient in accordance with the following equation (12). The frequency encoding displacement vector can then be calculated by multiplying the length $\Delta F$ by a unit vector $e_F$, which runs along the frequency encoding direction.

$$\Delta F = \frac{\Delta B_F}{G_F} \quad (12)$$

Alternatively, this length $\Delta F$ of the frequency encoding displacement vector can be calculated as a function of a recording pixel bandwidth $BW_{Rx}$ with the following equation (13).

$$\Delta F = \frac{\gamma}{2\pi} \cdot \frac{\Delta B_F}{BW_{Rx}} \quad (13)$$

During an imaging with phase encoding, which can be used as a function of the imaging method in one, two or three dimensions for the spatial encoding, the phase encoding is influenced by field deviations, which are present during the phase encoding on, and which have a correlation with the phase encoding gradients. The sum of these field deviations or the field deviation $\Delta B_P$ summed during the frequency encoding can be calculated by the following equation (14).

$$\Delta B_P = \Sigma_i B_{i,P} \quad (14)$$

where $B_{i,P}$ corresponds to those of the previously described field deviations, which are present in a time interval during which the phase encoding takes place, and are taken into account in accordance with the invention.

With the conventional or non echo-planar imaging (for instance spin-echo or gradient-echo imaging), in particular the field deviation caused by non-linearities in the gradient system and the field deviation caused by Maxwell fields have the afore-cited correlations, wherein the first generally dominates. For the non echo-planar imaging, the magnitude or the length $\Delta P$ of a local spatial phase encoding displacement vector can be calculated on the basis of the field deviation $\Delta B_P$ summed during the phase encoding, as a function of the amplitude $G_P$ of the phase encoding gradient in accordance with the following equation (15). With a phase encoding in several dimensions, in particular for each dimension, the length $\Delta P$ of a phase encoding displacement vector is calculated for the respective dimension which runs along the respective phase encoding direction. The corresponding phase encoding displacement vector can then be calculated by multiplying the corresponding length $\Delta P$ by a unit vector $e_P$ which runs along the phase encoding direction.

$$\Delta P = \frac{\Delta B_P}{G_P} \quad (15)$$

During the echo-planar imaging, a cumulative (continuous or "blipped") reshaping of the phase takes place over the echo train, so that the field deviation caused by field inhomogeneities and the field deviation caused by dynamic field disturbances are also relevant. As a function of an increment of the magnetic moment $M_P$ of the phase encoding gradient between two consecutive k-space lines, the length $\Delta P$ of a local spatial phase encoding displacement vector is produced along the phase encoding direction according to the following equation (16).

$$\Delta P = \int \frac{\Delta B_P}{M_P} dt \quad (16)$$

While the field deviation caused by non-linearities in the gradient system and the field deviation caused by the Maxwell fields are generally only present during the switching of the phase encoding gradient, the field deviation caused by field inhomogeneities and the field deviation caused by dynamic field disturbances are mostly present more or less continuously. In principle, however, temporally variable field deviations $\Delta B_P(t)$ can also be taken into account via the averaging over time described by the equation (16).

Using an effective recording pixel bandwidth $BW_{Rx,eff}$ and an effective field deviation $\Delta B_{P,eff}$, which can be calculated on the basis of the following equation (17), the length $\Delta P$ of the phase encoding displacement vector can be calculated on the basis of the following equation (18).

$$\Delta B_{P,eff} = \frac{1}{T} \int \Delta B_P dt \quad (17)$$

$$\Delta P = \frac{\gamma}{2\pi} \cdot \frac{\Delta B_{P,eff}}{BW_{Rx,eff}} \quad (18)$$

where T corresponds to a time span during which the respective reshaping of the phase is performed.

In accordance with the invention, the respective displacement vector for the image pixels therefore results from the knowledge of the summed field deviation, wherein this displacement vector can be calculated on the basis of the length $\Delta S$ of the slice selection displacement vector, the length $\Delta F$ of the frequency encoding displacement vector and the length(s) $\Delta P$ of the phase encoding displacement vector or vectors, for instance, in accordance with the following equation (19).

$$\Delta R(x, y, z) = \begin{pmatrix} \Delta S \\ \Delta F \\ \Delta P \end{pmatrix} \quad (19)$$

The displacement vector $\Delta R$ is therefore composed of a component $\Delta S$ along the slice selection direction, a component $\Delta F$ along the frequency encoding direction and a component along the phase encoding direction. During a phase encoding in several dimensions, in particular for each dimension, a phase encoding displacement vector with a respective length $\Delta Pi$ exists for the respective dimension, which runs along the respective phase encoding direction (cf. above). In this case the displacement $\Delta R$ is formed by a combination of the slice selection displacement vector (of length $\Delta S$), the frequency encoding displacement vector (of length $\Delta F$) and the multiplicity of phase encoding displacement vectors (each of length $\Delta Pi$).

This displacement vector $\Delta R$ can be used, in accordance with the invention, to calculate the (distorted) image position to which the signal portions of the image pixel have been displaced at the physical position R=(x, y, z) in the examination object. Here the displacement vector advantageously contains the portion of several (at least two) of the four described distortion types and in this way implicitly takes transverse dependencies into account, since all considered physical effects can be causally attributed back to field deviations and these field deviations overlie one another independently.

The present invention will be described again below in context.

For each target pixel image B=(S, F, P) in what is known as an encoding system, the associated ideal target image pixel R=(x, y, z) (i.e. assigned without image distortion) is determined in the physical system. In such cases S or F or P are the coordinates in the slice selection direction or frequency encoding direction or phase encoding direction. In more precise terms, the associated ideal object coordinate R is determined in the encoding system for each image pixel coordinate B. The transformation rule required herefor in order to transform B into R is prespecified by the respective imaging sequence and known.

The assigned local displacement vector $\Delta R(x, y, z)=(\Delta S, \Delta F, \Delta P)$ (cf. equation (19)) is calculated for each target image pixel R or for each position R.

In the at least one MR image reconstructed from the acquired MR data, the position or the actual image pixel B' is calculated in accordance with the following equation (20).

$$B' = B + \Delta R \quad (20)$$

The signal portion of the target image pixel B was displaced to this position or to this image pixel B' on account of the field deviations.

The signal or the signal portion in the actual image pixel B' is now assigned to the target image pixel B.

Since the position of the actual image pixel B' generally does not correspond to any of the (discretized) recorded pixel positions, the signal portion in the actual image pixel B' is advantageously interpolated on the basis of signal portions of image pixels, the positions of which are disposed adjacent to the position of the image pixel B'. The signal portions of these image pixels were determined by the MR data acquisition and subsequent reconstruction without taking the field deviations into account. The interpolation can be performed for instance by a linear, cubic or spline interpolation of the recorded signals or signal portions of the image pixels adjacent to the image pixel B' in two or three dimensions.

Furthermore, a change in density of signal portions of the displaced image pixels caused by the summed field deviation can be calculated and corrected.

To this end the local change in density can be determined for instance by a calculation of the Jacobian determinant J(B') at this image pixel B'.

To this end it should be noted that image distortions may result locally in a compression of signal portions of a larger object region onto a smaller image region. This compression results in the image intensity in effect pushing together, which results in a brightening in this image region. Similarly image distortions can result locally in an expansion of the signal portions, as a result of which opposite effects occur. The Jacobian determinant acquires the characteristics of this local change in density (compression or expansion) and thus permits a correction.

According to this embodiment, the signal value $S_{corrected}(B)$ is assigned to the image pixel B, which is calculated in accordance with the following equation (21).

$$S_{corrected}(B) = S_{recorded}(B') * J(B') \quad (21)$$

where $S_{recorded}(B')$ corresponds to the interpolated signal portion in the position or the image pixel B'.

The present invention also encompasses a magnetic resonance apparatus that has an MR data acquisition scanner with a basic field magnet, one or more RF antennas, and gradient coils. The apparatus also has an RF controller, a gradient coil controller, an image sequence controller and a computer, which are designed to correct multiple distortion effects during an imaging. The magnetic resonance apparatus is designed to acquire MR data of a volume segment of an examination object and to reconstruct, using the computer, at least one MR image, which has multiple image pixels, from the acquired MR data. Furthermore, the magnetic resonance apparatus is designed to calculate a summed field deviation, with respect to a target magnetic field or a magnetic field assumed to have been generated by the magnetic resonance system and in order to calculate, using the computing unit, a respective displacement vector for the image pixels as a function of the summed field deviation. A respective signal portion, which corresponds to a signal portion of an image pixel, which has been displaced with the respective displacement vector from the respective image pixel, is assigned by the magnetic resonance apparatus to the image pixels. In such cases the computer calculates the summed field deviation by a sum of at least two of the following field deviations:

a field deviation of the magnetic field caused by non-linearities in gradient coils of the magnetic resonance apparatus,
 a field deviation of the magnetic field caused by Maxwell fields,
 a field deviation of the magnetic field caused by field inhomogeneities, which is independent of gradients switched by the magnetic resonance apparatus, and
 a field deviation of the magnetic field caused by dynamic field disturbances.

The advantages of the inventive magnetic resonance system correspond essentially to the advantages of the inventive method, which are explained above in detail.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all of the embodiments of the method according to the invention, as described above.

The computer code may use other functions such as libraries and auxiliary functions in order to realize the corresponding embodiments of the method. The code can be a source code (e.g. C++) which must still be compiled (translated) and bound or which must only be interpreted, or is an executable software code which, for execution, need only be loaded into the corresponding computer or computer system.

For simple geometric distortions (for instance for displacement, shearing and scaling), the corrections of distortion effects can also be carried out effectively in k-space. With complex geometric distortions, corrections in k-space are however very slow compared with the present invention, which carries out the corrections in the position space or image region, so that the corrections in k-space cannot be used in practice in complex geometric distortions.

BRIEF DESCRIPTION OF THE DRAWINGS

FIG. 3 is a flowchart of an inventive method.

DESCRIPTION OF THE PREFERRED EMBODIMENTS

Figure 1:
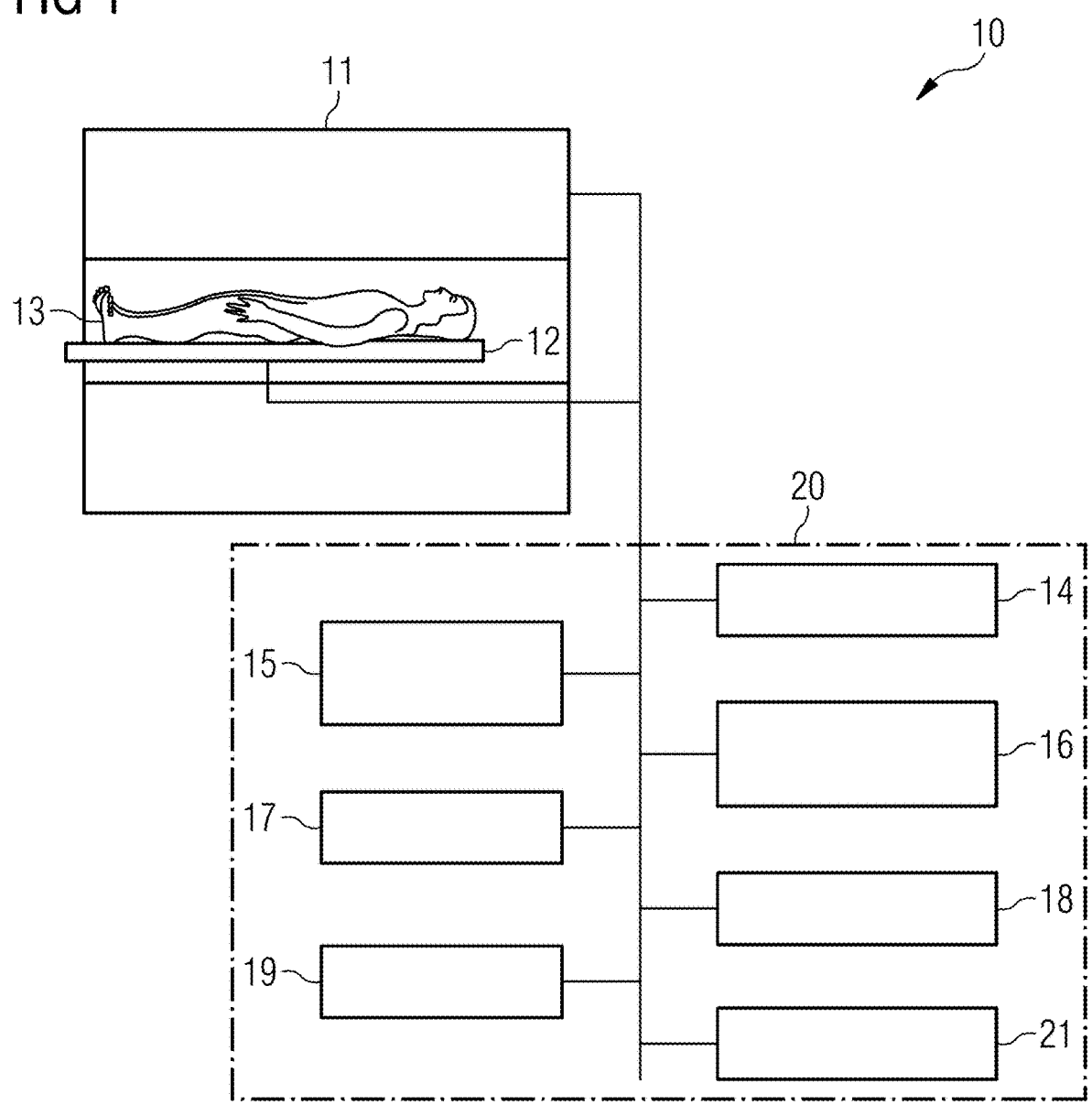
FIG. 1 schematically illustrates an inventive magnetic resonance system.

With reference to FIG. 1, a magnetic resonance apparatus 10 is explained, with which, as described below, multiple distortion effects are corrected during the imaging. The magnetic resonance apparatus 10 has a scanner 11 with a basic field magnet that generates a polarization field B0. An examination person 13 on a bed 12 is moved into the scanner 11, in order to acquire spatially encoded magnetic resonance signals (MR data) from the examination patient 13. The coils or antennas used for signal recording, such as a whole body coil or local coils, are not shown for clarity. By radiating radio-frequency energy and switching magnetic field gradients, the magnetization of certain nuclear spins in the person 13, produced by the polarization field B0, is deflected out of the equilibrium position and positionally encoded, and signals caused the resultant magnetization are detected by the receiving coils. It is in principle known to those skilled in the art how MR images are generated by radiating RF pulses and switching magnetic field gradients in different combinations and sequences, so this need not be explained in greater detail herein.

The magnetic resonance apparatus 10 also has a control unit 20 that controls the magnetic resonance apparatus 10. The control unit 20 has a gradient controller 15 for the control and switching of the necessary magnetic field gradients. An RF controller 14 is provided for the control and generation of the RF pulses for deflecting the magnetization. An image sequence controller 16 controls the sequence of the magnetic field gradients and RF pulses and thus indirectly the gradient controller 15 and the RF controller 14. Via an input unit 17, an operator can control the magnetic resonance apparatus 10 and on a display unit 18, MR images and other information necessary for the control can be displayed. A computer 19 with at least one processor (not shown) is provided for controlling the different units in the control unit 20 and for carrying out computing operations. Furthermore, a memory 21 is provided in which, for example, program modules or programs can be stored which, when executed by the computer 19 or its processor, control the sequence of the magnetic resonance apparatus 10. The computer 19 is designed or programmed to calculate the MR images from the acquired MR signals, with multiple distortion effects also being corrected.

Figure 2:
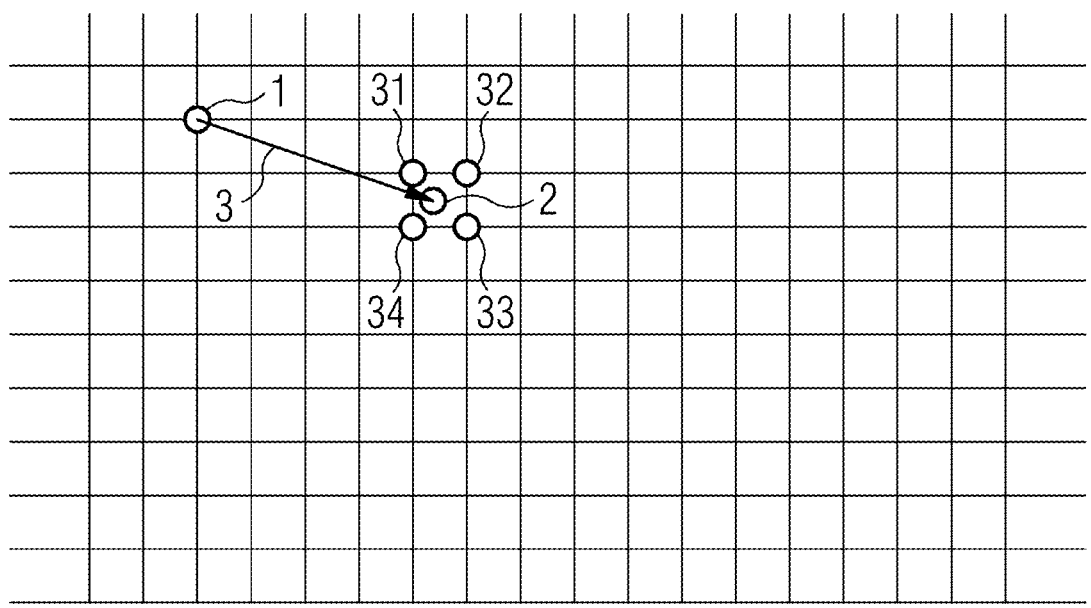
FIG. 2 illustrates an example for explaining the present invention.

In FIG. 2 an image pixel 1 is shown in the image region, which corresponds to the target image pixel and accordingly has ideal (i.e. without taking distortion effects into account) object coordinates (x, y). The image pixel 1 corresponds accordingly to the image pixel previously referred to as R, wherein for representational reasons the position of the image pixel 1 is restricted to two dimensions.

Field deviations due to distortion effects mean that a displacement vector 3 results with the image pixel 1 (at the position of the image pixel 1). This displacement vector 3 is calculated according to the invention as a function of the summed field deviation on the image pixel 1. The summed field deviation corresponds to the sum of field deviations determined to have been caused by distortion effects and is likewise calculated in accordance with the invention. On the basis of the displacement vector 3 calculated in this way, the actual image pixel 2 can be calculated, to the position of which in the recorded, distorted reconstructed MR images, the signal portion of the target image pixel 1 has been displaced. The image pixel 2 corresponds accordingly to the image pixel (cf. equation (20)) previously referred to as B'.

Since the image pixel 2 is not present at any discretized, recorded pixel position (i.e. at any crossing point of the lines identified in FIG. 2), the signal portion of the image pixel 2 is interpolated on the basis of the signal portions of the adjacent image pixels 31-34. This signal portion interpolated in this way is finally assigned to the target image pixel 1.

FIG. 3 shows a flowchart for an embodiment of the method for correcting multiple distortion effects according to the invention.

In step S1 the field deviation as a result of non-linearities in the gradient system is determined. In step S2 the field deviation as a result of the Maxwell fields is determined. In step S3, the field deviation caused by field inhomogeneities is determined. In step S4, the field deviation caused by dynamic field disturbances is determined.

In step S5, in the embodiment shown in FIG. 3, the field deviations determined previously in steps S1 to S4 are summed in order, as a result, to calculate the summed field deviation. In accordance with the invention, it is also possible, however, to add together only two or only three of the four field deviations determined previously in steps S1 to S4 in order to calculate the summed field deviation.

In step S6, an individual displacement vector for each target image pixel is calculated for each target image pixel 1 as a function of the summed field deviation calculated previously and applying at the position of the respective target image pixel. With the aid of this individual displacement vector, the associated actual image pixel is determined for each target image pixel. In other words, the position to which the signal portion of the target image pixel has been displaced as a result of the distortion effects taken into account is determined on the basis of the individual displacement vector for each target image pixel.

The signal portion of the actual image pixel is then assigned to the respective target image pixel in step S8. In other words, the signal portion at the position determined previously with the displacement vector is calculated using interpolation and density correction, for instance, and then assigned to the respective target image pixel. As a result, in accordance with the invention multiple distortion effects are corrected optimally in the imaging.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image of a subject that is corrected with regard to multiple distortion effects that occur during acquisition of MR raw data, said method comprising:

operating an MR data acquisition scanner to execute an MR data acquisition pulse sequence and measuring, during defined portions of said MR data acquisition pulse sequence, an average value of a magnetic field generated by said MR data acquisition scanner;

after operating the MR data acquisition scanner to execute the MR data acquisition pulse sequence and measuring the average value, operating the MR data acquisition scanner in order to acquire raw MR data from a volume segment of an examination subject by executing the MR data acquisition pulse sequence, wherein the MR data acquisition pulse sequence produces dynamic field disturbances;

providing said raw MR data to a computer and, in said computer, reconstructing an MR image of said volume segment from said raw MR data, said MR image comprising a plurality of image pixels;

in said computer, calculating a summed field deviation with respect to a magnetic field that is assumed to have been generated by said MR data acquisition scanner when said raw MR data were acquired;

in said computer, calculating the dynamic field disturbances as a field deviation represented by the average value;

in said computer, for each respective image pixel, calculating a respective displacement vector from said summed field deviation, and assigning a respective signal contribution to each respective image pixel that represents a displacement of that respective image pixel by the respective displacement vector calculated for that respective image pixel, from that respective image pixel in said MR image;

selecting said summed field deviation as a sum of field deviations of said magnetic field, the field deviations including:
   a field deviation caused by non-linearities in a gradient system of the MR data acquisition scanner,
   a field deviation caused by Maxwell fields,
   a field deviation caused by field inhomogeneities that are independent of gradients activated by said MR data acquisition scanner,
   a field deviation caused by the dynamic field disturbances, and
   a field distribution caused by the dynamic field disturbances; and in said computer, using the respective calculated signal contributions of the respective image pixels to generate a distortion-corrected MR image of said volume segment, and making said distortion-corrected image of said volume segment available in electronic form from said computer, as a data file.

2. A method as claimed in claim 1 wherein one of said field deviations in said summed field deviation is said field deviation caused by non-linearities in said gradient system, and comprising providing said computer with an input that designates a design of said gradient system and, in said computer, determining said non-linearities of said gradient system dependent on said design of the gradient system.

3. A method as claimed in claim 1 wherein one of said field deviations in said summed field deviation is said field deviation caused by Maxwell fields, and comprising providing said computer with an input that designates a design of said gradient system, and calculating, in said computer, said field deviation caused by Maxwell fields by applying Maxwell equations to said design of said gradient system.

4. A method as claimed in claim 1 wherein one of said field deviations in said summed field deviation is said field deviation caused by field inhomogeneities, and comprising calculating said field inhomogeneities in said computer from inputs provided to said computer that designate a magnetic interaction of the examination object with said magnetic field.

5. A method as claimed in claim 1 wherein one of said field deviations in said summed field deviation is said field deviation caused by field inhomogeneities, and comprising:
identifying an inhomogeneity of said magnetic field by operating said MR data acquisition scanner prior to acquisition of said MR raw data; and
providing the measured inhomogeneity of said magnetic field to said computer and, in said computer, calculating said field deviation caused by field inhomogeneities from the measured inhomogeneity of said magnetic field.

6. A method as claimed in claim 1 comprising:
operating said MR data acquisition scanner to acquire said MR raw data in a selected slice of said volume segment, by activating a slice selection gradient in a slice selection direction;
in said computer, calculating a slice selection displacement vector associated with said slice selection gradient dependent on field deviations of said magnetic field that occur along said slice selection direction; and
calculating the respective displacement vectors for said respective image pixels dependent on said slice selection displacement vector.

7. A method as claimed in claim 6 comprising, in said computer, calculating a length ΔS of said slice selection displacement vector as $$\Delta S = \frac{\Delta B_s}{G_s},$$

wherein $\Delta B_S$ is a sum of said field deviations that occurred during said slice selection gradient and $G_S$ is an amplitude of said slice selection gradient.

8. A method as claimed in claim 1 comprising:
operating said MR data acquisition scanner to acquire said MR raw data in a selected slice of said volume segment, by activating a frequency encoding gradient in a frequency encoding direction;
in said computer, calculating a slice selection displacement vector associated with said frequency encoding gradient dependent on field deviations of said magnetic field that occur along said frequency encoding direction; and
calculating the respective displacement vectors for said respective image pixels dependent on said frequency encoding displacement vector.

9. A method as claimed in claim 8 comprising, in said computer, calculating a length ΔF of said frequency encoding displacement vector as $$\Delta F = \frac{\Delta B_F}{G_F},$$

wherein $\Delta B_F$ is a sum of said field deviations that occur during said frequency encoding gradient and $G_F$ is an amplitude of said frequency encoding gradient.

10. A method as claimed in claim 1 comprising:
operating said MR data acquisition scanner to acquire said MR raw data in a selected slice of said volume segment, by activating a phase encoding gradient in a phase encoding direction;
in said computer, calculating a slice selection displacement vector associated with said phase encoding gradient dependent on field deviations of said magnetic field that occur along said phase encoding direction; and
calculating the respective displacement vectors for said respective image pixels dependent on said phase encoding displacement vector.

11. A method as claimed in claim 10 comprising:
operating said MR data acquisition scanner in order to acquire said MR raw data from said volume segment by executing a non echo-planar data acquisition procedure; and
in said computer, calculating a length of said phase encoding gradient vector ΔP as $$\Delta P = \frac{\Delta B_P}{G_P},$$

wherein $\Delta B_P$ is a sum of correlated field deviations during said phase encoding gradient and $G_P$ is an amplitude of said phase encoding gradient.

12. A method as claimed in claim 10 comprising:
operating said MR data acquisition scanner in order to acquire said raw MR data from said volume segment by executing an echo-planar procedure; and
in said computer, calculating a length ΔP of said phase encoding displacement vector as $$\Delta P = \int \frac{\Delta B_P}{M_P} dt,$$

wherein $\Delta B_P$ is a sum of field deviations that occurred during said phase encoding gradient and $M_P$ is an amplitude of a magnetic moment of said phase encoding gradient.

13. A method as claimed in claim 1 comprising calculating the respective signal contribution of each image pixel, displaced by the respective displacement vector for that respective image pixel, by an interpolation of respective signal contributions of other image pixels that are adjacent to the respective image pixel, when displaced by the respective displacement vector.

14. A method as claimed in claim 1 comprising generating said distortion-corrected image of said volume segment by determining, in said computer, a change in density of respective signal contributions of the respective image pixels, respectively displaced by the respective displacement vectors.

15. A magnetic resonance (MR) apparatus comprising:
an MR data acquisition scanner; and
a computer configured to:
  operate said MR data acquisition scanner to execute an MR data acquisition pulse sequence and measure, during defined portions of said MR data acquisition pulse sequence, an average value of a magnetic field generated by said MR data acquisition scanner;
  after operating the MR data acquisition scanner to execute the MR data acquisition pulse sequence and measuring the average value, operate said MR data acquisition scanner in order to acquire raw MR data from a volume segment of an examination subject by executing the MR data acquisition pulse sequence, wherein the MR data acquisition pulse sequence produces dynamic field disturbance;
  reconstruct an MR image of said volume segment from said raw MR data, said MR image comprising a plurality of image pixels;
  calculate a summed field deviation with respect to a magnetic field that is assumed to have been generated by said MR data acquisition scanner when said raw MR data were acquired;
  calculate the dynamic field disturbances as a field deviation represented by the average value;
  for each respective image pixel, calculate a respective displacement vector from said summed field deviation, and assigning a respective signal contribution to each respective image pixel that represents a displacement of that respective image pixel by the respective displacement vector calculated for that respective image pixel, from that respective image pixel in said MR image, wherein said summed field deviation is selected as a sum of field deviations of said magnetic field, the field deviations including:
    a field deviation caused by non-linearities in a gradient system of the MR data acquisition scanner,
    a field deviation caused by Maxwell fields,
    a field deviation caused by field inhomogeneities that are independent of gradients activated by said MR data acquisition scanner,
    a field deviation caused by the dynamic field disturbances, and
    a field distribution caused by the dynamic field disturbances; and
  use the respective calculated signal contributions of the respective image pixels to generate a distortion-corrected MR image of said volume segment, and to make said distortion-corrected image of said volume segment available in electronic form from said computer, as a data file.

16. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
  operate an MR data acquisition scanner to execute an MR data acquisition pulse sequence and measure, during defined portions of said MR data acquisition pulse sequence, an average value of a magnetic field generated by said MR data acquisition scanner;
  after operating the MR data acquisition scanner to execute the MR data acquisition pulse sequence and measuring the average value, operate the MR data acquisition scanner in order to acquire raw MR data from a volume segment of an examination subject by executing the MR data acquisition pulse sequence, wherein the MR data acquisition pulse sequence produces dynamic field disturbances;
  reconstruct an MR image of said volume segment from said raw MR data, said MR image comprising a plurality of image pixels;
  calculate a summed field deviation with respect to a magnetic field that is assumed to have been generated by said MR data acquisition scanner when said raw MR data were acquired;
  calculate the dynamic field disturbances as a field deviation represented by the average value;
  for each respective image pixel, calculate a respective displacement vector from said summed field deviation, and assigning a respective signal contribution to each respective image pixel that represents a displacement of that respective image pixel by the respective displacement vector calculated for that respective image pixel, from that respective image pixel in said MR image, wherein said summed field deviation is selected as a sum of field deviations of said magnetic field, the field deviations including:
    a field deviation caused by non-linearities in a gradient system of the MR data acquisition scanner,
    a field deviation caused by Maxwell fields,
    a field deviation caused by field inhomogeneities that are independent of gradients activated by said MR data acquisition scanner,
    a field deviation caused by the dynamic field disturbances, and
    a field distribution caused by dynamic field disturbances; and
  use the respective calculated signal contributions of the respective image pixels to generate a distortion-corrected MR image of said volume segment, and make said distortion-corrected image of said volume segment available in electronic form from said computer, as a data file.

17. A method as claimed in claim 1 wherein the summed field deviation is a difference between the magnetic field that is assumed to have been generated by said MR data acquisition scanner when said raw MR data were acquired and an actual magnetic field generated by said MR data acquisition scanner when said raw MR data were acquired.

18. A method as claimed in claim 1 wherein the summed field deviation is calculated based on a difference between the magnetic field that is assumed to have been generated by said MR data acquisition scanner when said raw MR data were acquired and an actual magnetic field generated by said MR data acquisition scanner when said raw MR data were acquired.

* * * * *